(12) United States Patent
Fermon et al.

(10) Patent No.: US 8,432,163 B2
(45) Date of Patent: Apr. 30, 2013

(54) METHOD FOR LOW FREQUENCY NOISE CANCELLATION IN MAGNETO-RESISTIVE MIXED SENSORS

(75) Inventors: Claude Fermon, Orsay (FR); Hedwige Polovy, Paris (FR); Myriam Pannetier-Lecoeur, Bures sur Yvette (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 798 days.

(21) Appl. No.: 12/663,798

(22) PCT Filed: Jun. 27, 2007

(86) PCT No.: PCT/IB2007/003021
§ 371 (c)(1),
(2), (4) Date: Dec. 9, 2009

(87) PCT Pub. No.: WO2009/001160
PCT Pub. Date: Dec. 31, 2008

(65) Prior Publication Data
US 2010/0173783 A1 Jul. 8, 2010

(51) Int. Cl.
*G01R 33/02* (2006.01)
(52) U.S. Cl.
USPC .............. 324/248; 324/207.21; 324/207.13; 324/252; 324/257; 324/207.23; 324/260; 324/244; 324/117 R; 324/117 H; 324/262; 324/249; 324/251; 324/258; 338/32 R; 338/32 H; 505/160; 505/162; 327/527; 327/528; 327/370
(58) Field of Classification Search .................. 324/248, 324/207.21, 207.13, 252, 257, 207.23, 260, 324/244, 117 R, 117 H, 262, 249, 251, 258; 338/32 R, 32 H; 505/160, 162; 327/527, 327/528, 370
See application file for complete search history.

(56) References Cited

U.S. PATENT DOCUMENTS
4,489,274 A  12/1984  Berlincourt
4,663,590 A   5/1987  Gershenson et al.
(Continued)

FOREIGN PATENT DOCUMENTS
EP     0413388      2/1991
WO     WO 94/18576  8/1994
(Continued)

OTHER PUBLICATIONS

Prabhakar et al., "Time Domain Analysis of Low Frequency Noise in Giant Magneto-Resistive Recording Heads", IEEE Transactions in Magnetics, vol. 36, No. 5, Sep. 2000, pp. 3621-3623.*
(Continued)

*Primary Examiner* — Patrick Assouad
*Assistant Examiner* — Lamarr Brown
(74) *Attorney, Agent, or Firm* — Preti Flaherty Beliveau & Pachios LLP

(57) ABSTRACT

The method for cancellation of low frequency noise in a magneto-resistive mixed sensor (1) comprising at least a superconducting loop with at least one constriction and at least one magneto-resistive element (6) comprises a set of measuring steps with at least one measuring step being conducted with the normal running of the mixed sensor and at least another measuring step being conducted whilst an additional super-current is temporarily injected in the at least one constriction of the at least one superconducting loop of the mixed sensor (1) up to a critical super-current of the constriction so that the result of the at least another measuring step is used as a reference level of the at least one magneto-resistive element (6).

8 Claims, 4 Drawing Sheets

U.S. PATENT DOCUMENTS

| | | | | |
|---|---|---|---|---|
| 5,095,270 | A * | 3/1992 | Ludeke | 324/248 |
| 6,339,328 | B1 * | 1/2002 | Keene et al. | 324/248 |
| 7,342,396 | B2 * | 3/2008 | Pannetier et al. | 324/248 |
| 7,511,483 | B2 * | 3/2009 | Pannetier et al. | 324/244 |
| 7,855,555 | B2 * | 12/2010 | Biziere et al. | 324/252 |
| 8,129,988 | B2 * | 3/2012 | Fermon et al. | 324/252 |
| 8,188,901 | B1 * | 5/2012 | Inamdar et al. | 341/156 |
| 2004/0239319 | A1 | 12/2004 | Tralshawala et al. | |
| 2006/0220641 | A1 * | 10/2006 | Pannetier et al. | 324/248 |
| 2008/0186023 | A1 * | 8/2008 | Biziere et al. | 324/252 |
| 2009/0015250 | A1 * | 1/2009 | Sunier et al. | 324/244 |
| 2009/0212771 | A1 * | 8/2009 | Cummings et al. | 324/252 |
| 2009/0251316 | A1 * | 10/2009 | Mamourian et al. | 340/540 |
| 2009/0309581 | A1 * | 12/2009 | Fermon et al. | 324/207.21 |
| 2010/0213932 | A1 * | 8/2010 | Utsunomiya | 324/251 |
| 2010/0308816 | A1 * | 12/2010 | Ueda et al. | 324/260 |

FOREIGN PATENT DOCUMENTS

| | | |
|---|---|---|
| WO | WO 2004 068152 | 8/2004 |
| WO | WO 2004/068158 | 8/2004 |
| WO | WO 2007/095971 | 8/2007 |

OTHER PUBLICATIONS

Hempstead, "Analysis of Thermal Noise Spike Cancellation", IEEE Transactions on Magnetics, vol. Mag-11, No. 5, Sep. 1975.*

Pannetier, M. et al., "Ultra-sensitive mixed sensors—Design and performance," Sensors and Actuators A, Elsevier Sequoia S.A., Lausanne, CH, vol. 129, No. 1-2, May 2006, pp. 247-250.

Pannetier, M. et al., "Noise in small magnetic systems—applications to very sensitive magnetoresistive sensors," Journal of Magnetism and Magnetic Materials, Elsevier Science Publishers, Amsterdam, NL, vol. 290-291, Apr. 2005, pp. 1158-1160.

Pannetier-Lecoeur, M. et al., "RF Response of Superconducting-GMR Mixed Sensors, Application to NQR," IEEE Transactions on Applied Superconductivity, IEEE Service Center, Los Alamitos, CA, vol. 17, No. 2, Jun. 2007, pp. 598-601.

Sun, J.Z. et al., "Direct-Coupled High-$T_c$ Thin Film Squids Using Step-Edge Weak-Link Junctions," Applied Superconductivity, Pergamon Press, Exeter, GB, vol. 3, No. 7-10, Jul. 1995, pp. 425-441.

Pannetier, M. et al., "Femtotesla Magnetic Field Measurement With Magnetoresistive Sensors," Science, American Association for the Advancement of Science, Washington, DC, vol. 304, No. 5677, Jun. 2004, pp. 1648-1650.

Raquet, B. et al., "Electronic noise in magnetic low-dimensional materials and nanostructures," Journal of Magnetism and Magnetic Materials, Elsevier Science Publishers, Amsterdam, NL, vol. 258-259, Mar. 2003, pp. 119-124.

Jiang, L. et al., "Low-frequency magnetic and resistance noise in magnetic tunnel junctions," Physical Review, American Institute of Physics, New York, vol. 69, No. 5, Feb. 2004, pp. 054407-1-054407-9.

Magnes, W. et al., "A sigma-delta fluxgate magnetometer for space applications," Measurement Science and Technology, IOP, Bristol, GB, vol. 14, No. 7, Jul. 2003, pp. 1003-1012.

Kubik, J. et al., "Noise spectrum of pulse excited fluxgate sensor," Sensors and Actuators A, Elsevier Sequoia S.A., Lausanne, CH, vol. 132, No. 1, Nov. 2006, pp. 236-240.

Munter, P., "A Low-offset Spinning-current Hall Plate," Sensors and Actuators A, Elsevier Sequoia S.A., Lausanne, CH, vol. A22, No. 1, Mar. 1990, pp. 743-746.

Caputo, P. et al., "Superconducting Quantum Interference Filters as Absolute Magnetic Field Sensors," IEEE Transactions on Applied Superconductivity, IEEE Service Center, Los Alamitos, CA, vol. 15, No. 2, Jun. 2005, pp. 1044-1047.

Tsukamoto, A. et al., "Noise properties of highly balanced $YBa_2Cu_3O_y$ directly coupled gradiometers and MCG measurement in magnetically unshielded environment," Physica C, North-Holland Publishing, Amsterdam, NL, vol. 368, No. 1-4, Mar. 2002, pp. 41-44.

Zrubec, V., "Theoretical sensitivity limits of the compensation method for magnetization characteristics measurement of $HT_c$ superconducting materials using $LT_c$ SQUID $2^{nd}$ order gradiometer," Cryogenics, Elsevier, Kidlington, GB, vol. 39, No. 3, Mar. 1999, pp. 241-251.

Myers, W. et al., "Calculated signal-to-noise ratio of MRI detected with SQUIDs and Faraday detectors in fields from 10 µT to 1.5T," Journal of Magnetic Resonance, Academic Press, Orlando, FL, vol. 186, No. 2, Jun. 2007, pp. 182-192.

Du, J. et al., "Noise performance of HTS solid and meshed dc SQUID magnetometers in external magnetic fields," Physica C., North-Holland Publishing, Amsterdam, NL, vol. 411, No. 1-2, Sep. 2004, pp. 18-24.

Pannetier, M. et al., "Field line distribution in a mixed sensor," Sensors and Actuators A, Elsevier Sequoia S.A., Lausanne, CH, vol. 129, No. 1-2, May 2006, pp. 146-149.

* cited by examiner

METHOD FOR LOW FREQUENCY NOISE CANCELLATION IN MAGNETO-RESISTIVE MIXED SENSORS

BACKGROUND OF THE INVENTION

1. Field of the Invention

The present invention relates to a method for low frequency cancellation of noise in magneto-resistive mixed sensors.

The invention more specifically relates to a method for cancellation of low frequency noise in a magneto-resistive mixed sensor comprising at least a superconducting loop with at least one constriction and at least one magneto-resistive element.

Low frequency noise refers to the resistance noise of the magneto-resistive element created by low frequency fluctuations. This kind of noise appears in all physical systems and increases as the size of the system decreases. If f is the frequency of the low frequency fluctuations, the power density of the noise decreases as $1/f^\alpha$ where $\alpha$ is of the order of 1.

2. Description of the Related Art

The principle of mixed sensors which associate at least one superconducting loop and one magneto-resistive element for low frequency and RF applications is described in documents WO 2004/068152 A1 and WO 2004/068158 A1. The principle of the mixed sensors is also described in the publication Pannetier M., Fermon C., Le Goff G., et al. SCIENCE 304 (5677): 1648-1650 Jun. 11, 2004.

Each superconducting loop contains at least one constriction. When a magnetic field is applied on the said superconducting loop, a super-current is created in the loop. The super-current flows through the constriction and locally the current density is high. The at least one magneto-resistive element is placed on top or bottom of the constriction and senses the magnetic field created by the super-current. The ratio between the applied field and the magnetic field sensed by the magneto-resistive element can be several thousands for a $cm^2$ superconducting loop and micron size constriction. The low frequency noise of a mixed sensor is due to the low frequency resistance noise of the magneto-resistive element.

Low frequency noise levels of magneto-resistive elements have been extensively studied in the published literature. For example, Giant magneto-resistance (GMR) low frequency noise is discussed in Raquet B, Viret M, Costes M, et al., JOURNAL OF MAGNETISM AND MAGNETIC MATERIALS 258: 119-124 Sp. Iss. SI MARCH 2003. Noise in Tunnel magneto-resistive sensors (TMR) is discussed in L. Jiang et al, Phys. Rev. B 69, 2004 p 54407.

If the magnetic part of the low frequency noise can be cancelled by a proper design of the sensor (see Pannetier M., Fermon C., Le Goff G., et al. JOURNAL OF MAGNETISM AND MAGNETIC MATERIALS 290: 1158-1160 Part 2 Sp. Iss. SI APRIL 2005), the non magnetic part has at present not be cancelled.

Document WO 2004/068152 A1 describes the use of the saturating value of the magneto-resistive element as a reference to correct temperature and ageing variations. However, this technique is not suppressing the low frequency noise of the magneto-resistive element.

Document PCT/2006EP/002599) describes the use of modulation of the sensing current for moving the working frequency of the detection outside the field detection frequency. This technique can be used to work at a frequency higher than the low frequency noise but if it suppresses the low frequency noise coming from the preamplification chain, it does not suppress the noise coming from the resistance fluctuations.

Fluxgates use a field modulation technique based on their non linear response to suppress the low frequency noise (see Magnes W, Pierce D, Valavanoglou A, Means J, Baumjohann W, Russell C T, Schwingenschuh K, Graber G, Source: MEASUREMENT SCIENCE & TECHNOLOGY 14 (7): 1003-1012 JULY 2003). Use of harmonics with pulsed currents has also been proposed (see Kubik J, Ripka P, SENSORS AND ACTUATORS A-PHYSICAL 132 (1): 236-240 Sp. Iss. SI, Nov. 8, 2006).

These approaches cannot be applied to mixed sensors due to their linear response in the working field range.

This technique has also been tested on mixed sensors (Document WO 2004/068152 A1) but its efficiency, which is proportional to the second derivative of the resistance variation, is not sufficiently competitive due to the low non linearity of the magneto-resistive sensors.

More generally, for all types of magnetic sensors, it is known that a cancellation of the low frequency noise of a detection system can be done by a modulation of the source magnetic field at a sufficiently high frequency. Then the measurement of the source field is done around the frequency modulation and the low frequency noise of the detection system does not interfere with the measurement. A large number of publications and patents are applying that technique.

However, that technique cannot be applied when the field source cannot be modulated. This is the case of for example, the detection of magnetic fields created by the human body.

More specifically, in Hall effect based magnetic sensors, a high frequency switching of the current input and voltage output allows suppressing the low frequency noise. A description of such a method can be found in P. Munter, A low-offset spinning-current Hall plate, *Sens. Actuators A: Phys*. A22 (1990) (1-3), pp. 743-746 However, that technique is very specific to Hall sensors due to the vectorial nature of the Hall resistance (the measured voltage is perpendicular to the applied current direction) and cannot be applied to magneto-resistive sensors because the measured voltage is along the applied current direction.

SUMMARY OF THE INVENTION

The present invention aims at remedying the above mentioned drawbacks.

More specifically the present invention aims at suppressing the 1/f noise of the mixed sensor without requiring any field source modulation.

These aims are achieved due to a method for cancellation of low frequency noise in a magneto-resistive mixed sensor comprising at least a superconducting loop with at least one constriction and at least one magneto-resistive element, characterized in that it comprises a set of measuring steps with at least one measuring step being conducted with the normal operation of the mixed sensor and at least another measuring step being conducted whilst an additional super-current is temporarily injected in said at least one constriction of said at least one superconducting loop of the mixed sensor up to a critical super-current of the said constriction so that the result of the said at least another measuring step is used as a reference level of said at least one magneto-resistive element.

The invention uses a specific property of mixed sensors which is the presence of at least one superconducting micron size constriction in the main superconducting loop. A superconducting micron size constriction presents a critical current which depends only on the temperature for small applied fields. In the working magnetic field range of the mixed sensors, typically below 1 mT, the effect of magnetic field on the critical current density is almost negligible.

The method according to the present invention is characterized by the use of this critical current as an absolute reference for the determination of the resistance of the various magneto-resistive elements.

In order to create this reference state, an external action is applied which injects an additional super-current high enough to reach the critical current of the constriction.

This external action may be an injected current through conducting wires or an applied additional magnetic field which generates an additional current.

In the case of an injected current, this should be done at zero voltage in order to prevent heating of the constriction. The current to be injected is determined by the critical current density of the superconductor used.

In case of a current injected through an applied magnetic field, the current will be automatically limited to the critical current.

For mixed sensors, an external magnetic field smaller than 1 mT is sufficient to reach the critical current in the constriction.

More specifically, the external magnetic field should be calibrated for each sensor as it depends on the effective gain of the mixed sensor, constriction quality and working current of the magnetoresistive element.

According to an aspect of the invention the cancellation of low frequency noise is obtained by a set of a first and a second measuring steps, the first measuring step being conducted without any injected current whereas the second measuring step is conducted with the injection of an additional super current.

Thus at least a set of two measurements of the sensing element are done. The first measurement is performed with the super-current of the loop equal to the super-current created by the sensed field and the second measurement is performed when the external action is applied so that the critical current of the constriction is achieved. The difference between the two values is proportional to the external field variation and does not contain resistance fluctuations with frequencies lower than the inverse of the time difference between the two measurements. After the second measurement, the external action is then stopped for the next set of measurements.

According to a feature of the present invention at least one measuring step is conducted whilst at first an additional positive current is injected and then a negative current is injected.

According to a specific embodiment of the present invention the cancellation of low frequency noise is obtained by a set of three measuring steps, wherein a first measuring step is conducted without any injected current, a second measuring step is conducted with the injection of a positive additional current and a third measuring step is conducted with the injection of a negative additional current.

According to another embodiment of the present invention the cancellation of low frequency noise is obtained by a set of four measuring steps, wherein a first measuring step is conducted without any injected current, a second measuring step is conducted with the injection of a positive additional current, a third measuring step is conducted with the injection of a negative additional current and a fourth measuring step is conducted after the removal of the previously injected additional current, the result of the fourth measuring step constituting a reference for a next set of measuring steps.

More specifically according to a specific embodiment, a plurality of sets of four measuring steps are conducted and at the end of each set of measuring steps, the result of the fourth measuring step of the preceding set is subtracted from the result of the first measuring step of the current set to provide a first difference, the mean value of the results of the second and third measuring steps of the current set is subtracted from said first difference to provide a second difference and the mean value of the results of the second and third measuring steps of the first set is added to the second difference as a reference of zero super-current.

According to an embodiment of the invention, the additional current is injected by wires in some part of the superconducting loop of the mixed sensor.

According to another embodiment of the invention, the additional current is injected by the use of an additional magnetic field applied on the superconducting loop of the mixed sensor.

The frequency of the sampling (measurement of one set) should be chosen so the frequency is at least two times higher than the maximal frequency which is aimed to be detected.

The magneto-resistive element can be alternatively an anisotropic magneto-resistance (AMR), a giant magneto-resistance (GMR), a tunnel magneto-resistance (TMR) or any other resistance exhibiting a variation with the magnetic field which is sufficiently large.

BRIEF DESCRIPTION OF THE DRAWINGS

Other features and advantages of the invention will appear more readily from the following description of several embodiments of the present invention, given as examples, with reference to the enclosed drawings, on which.

DETAILED DESCRIPTION OF PREFERRED EMBODIMENTS

The invention essentially addresses a method which cancels the 1/f noise of magneto-resistive elements in mixed sensors.

Figure 1:
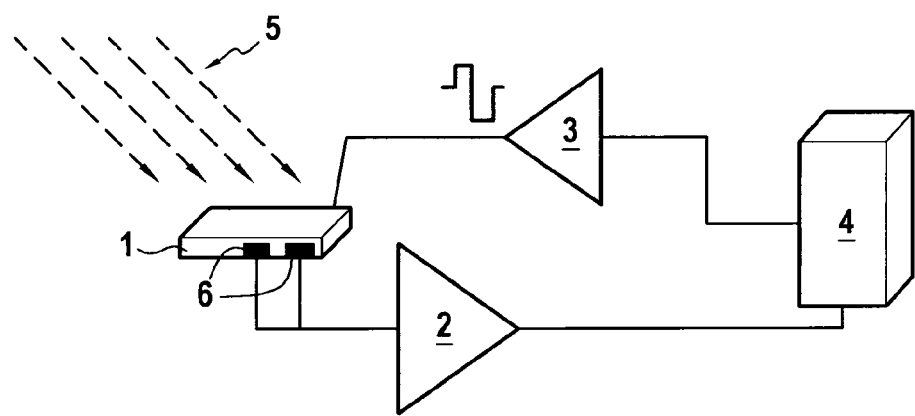
FIG. 1 is a block diagram illustrating the main components of a device for implementing the method according to the invention.

The principle of the measurement method will be explained hereafter with reference to FIG. 1.

The mixed sensor 1 is submitted to an external field 5. The mixed sensor 1 contains several magneto-resistive elements 6 which can present low frequency noise which appears as resistance fluctuations. An external action controlled by a computing system 4 is applied through an interface 3 to the mixed sensor 1. The outputs of the magneto-resistive elements 6 are amplified in an amplifier 2 and transmitted to the computing system 4 which performs the necessary subtractions.

Figure 2:
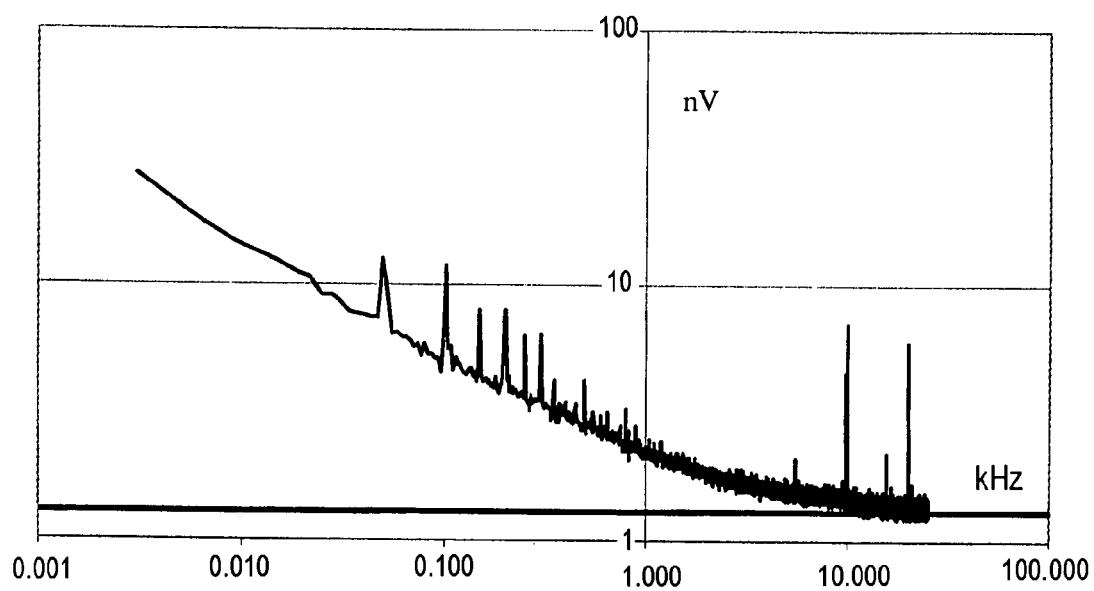
FIG. 2 gives a typical noise figure of a magnetoresistive element.

FIG. 2 shows a typical voltage noise of a magnetoresistive element. A 1/f noise appears below a frequency $f_c$ which depends on the material properties and magnetoresistive element configuration. In this example, $f_c$ is 10 KHz. The horizontal line is the thermal noise due to the resistance.

Figure 3:
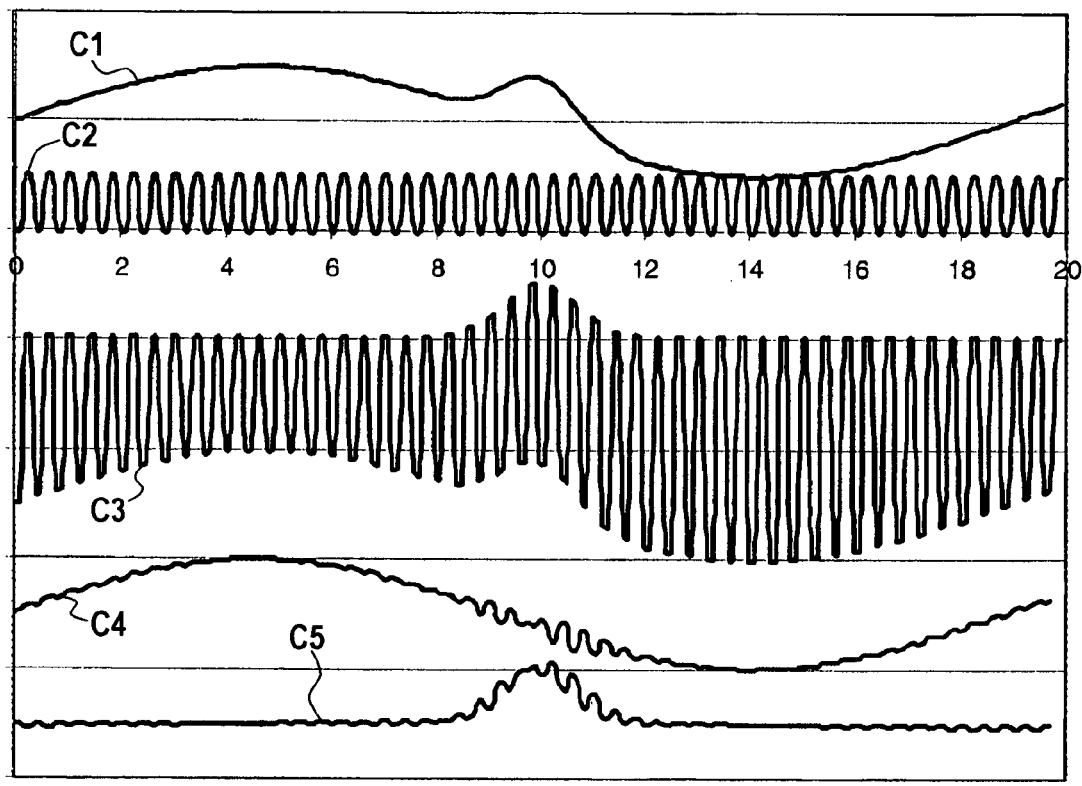
FIG. 3 shows the effect in time domain of the external action.

FIG. 3 shows the effect in time domain of the external action with a set of two measurements and the subtraction between the two measurements. Curve C1 (top) shows the total signal detected at the output of the magneto-resistive element without external action. This signal is a sum of the external field which is to be determined, modelled by a sinus function and of a resistance fluctuation, modelled by a Gaussian function. The curve C2 shows the external action (off-on). The curve C3 shows the output of the magneto-resistive element when there is an external action. The effective signal is oscillating from the total signal detected and the critical current with the fluctuation of the resistance at a frequency corresponding to the external action frequency. The curve C4 shows the external field variation deduced from the subtraction. The resistance fluctuation is shown on curve C5 and is deduced directly from the curve C3 when the external action is on. The frequency used for the external action should be equal to at least twice the maximal measured frequency.

Figure 4:
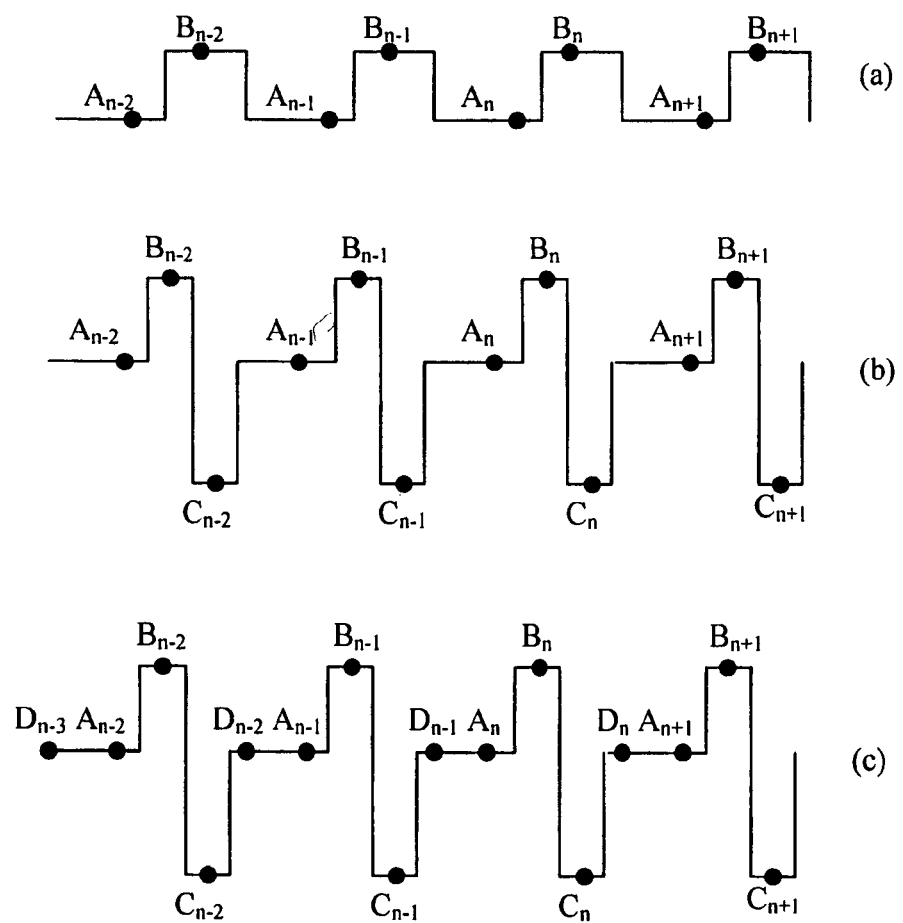
FIG. 4 gives the time sequences of the different embodiments.

FIG. 4 shows the time sequences for the different embodiments.

FIG. 4 (a) corresponds to a plurality of sets of two measurements. For each set of measurements, the first measurement is done without any external action ($A_n$) and the second measurement ($B_n$) is done in presence of the external action which induces a super-current equal to the critical current.

The final output is given in that case by $$OUT_n = A_n - B_n + B_1.$$

It should be noticed that $B_1$ obtained during the first set of measurements is considered as the reference of the critical current.

FIG. 3 (b) corresponds to a plurality of sets of three measurements. The first measurement is done without any external action ($A_n$), the second measurement ($B_n$) is done in presence of the external action which induces a positive super-current equal to the critical current and the third measurement ($C_n$) is done in presence of the external action which induces a negative super-current which is equal to minus the critical current.

The final output is given in that case by:

$$OUT_n = A_n - (B_n + C_n)/2 + (B_1 + C_1)/2.$$

It should be noticed that $(B_1 + C_1)/2$ obtained during the first set of measurements is considered as the reference of 0 super-current. This embodiment has the advantage to suppress the effect of the variation of the super-current with the temperature because $(B_n + C_n)/2$ is independent of the temperature.

FIG. 3 (c) corresponds to a plurality of sets of four measurements. The first measurement is done without any external action ($A_n$), the second measurement ($B_n$) is done in presence of the external action which induces a positive super-current equal to the critical current, the third measurement ($C_n$) is done in presence of the external action which induces a negative super-current which is equal to minus the critical current and the fourth measurement is done when the external action is stopped.

The final output is given in that case by:

$$OUTd_n = A_n - (B_n + C_n)/2 + (B_1 + C_1)/2 - D_{n-1}.$$

In that case, the output is proportional to the evolution of the signal between $D_{n-1}$ and $A_n$ renormalized to the reference given by the super-current.

This output is proportional to the derivative of the signal and not the signal itself.

This set of four measurements should be used in two cases.

The first case is when the external action has an effect on the super-current created by the external field and a new reference point should be used for each set of measurement. This is often the case when the external action is a magnetic field applied on the superconducting loop.

The second case is when the external magnetic field to be determined has fast variations and small amplitude. Then the first derivative can present a rather intense signal easier to detect.

Figure 5:
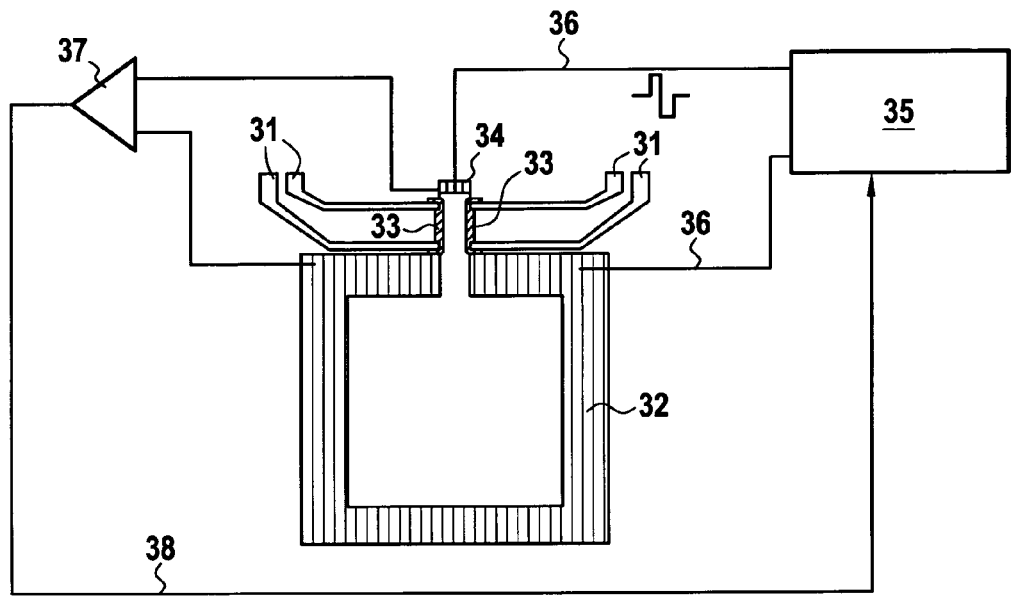
FIG. 5 is an example of a device where a half bridge configuration is used for the magnetoresistive elements and the external action is a current pulse and FIG. 6 is an example of a device where a magnetic field pulse is used for the external action.
Figure 6:
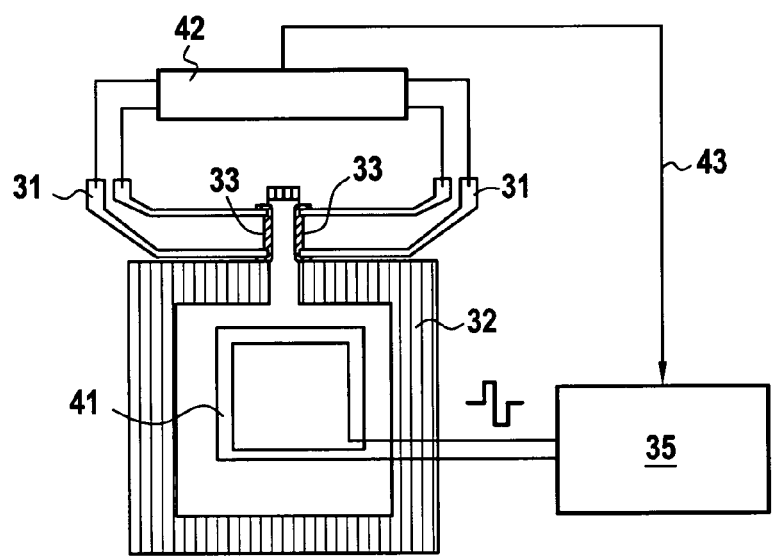

FIG. 5 describes a device which gives an example of the use of a current as an external action. A typical mixed sensor mounted as a magnetometer comprises a superconducting loop 32. The loop 32 contains two constrictions each associated with a magneto-resistive element 33. Each magneto-resistive element 33 has metallic contacts 31.

The external action is a pulsed current injected in the loop between the centre of the two constrictions and the main part of the loop through normal wires 36. The current is high enough to bring the two constrictions to their critical current and low enough to avoid the transition of the constrictions to the normal state. This can be done by using a source current 35 with a low voltage output.

A better control can be achieved by measuring independently the voltage on the two parts of the loop by a preamplifier 37. A voltage which is different from zero at the output of the preamplifier 37 is the signature of the reaching of the critical current of the constriction. The output of the preamplifier 37 can be used in a feedback design 38 to monitor the current source 35. The negative signal constituted by the minus critical current is achieved by reversing the current source.

FIG. 5 describes a device which gives an example of the use of an additional magnetic field as an external action. A typical mixed sensor mounted as a magnetometer comprises a superconducting loop 32. The loop 32 contains two constrictions with a magneto-resistive element 33. Each magneto-resistive element 33 has metallic contacts 31.

The external action is a magnetic field created by an additional loop 41 placed in the neighbourhood of the superconducting loop 32. A sufficiently high current is applied which brings at least one constriction to its critical current.

A control 42 may be achieved by monitoring the resistance of the magneto-resistive elements and stopping the increase of the magnetic field through a feedback link 43 when a constant value is achieved for the corresponding resistances. The negative signal constituted by the minus critical current is achieved by reversing the current in the additional loop 41.

According to an embodiment of the invention at least a set of two measurements of the sensing element are done in two measuring steps. The first measuring step is performed with the super-current of the loop equal to the super-current created by the sensed field and the second measuring step is performed when the external action is applied so that the critical current of the constriction is achieved. The difference between the two values is proportional to the external field variation and does not contain resistance fluctuations with frequencies lower than the inverse of the time difference between the two measurements. After the second measurement, the external action is then stopped for the next set of measurements.

According to another specific embodiment, a set of three measuring steps are performed: the first two measuring steps being as previously described and a third measuring step being done at minus the critical current (i.e. with a current having the same amplitude as the critical current and the opposite sign). Then the difference is calculated between the first measurement and the average of the second and third measurement. This embodiment allows suppressing the temperature dependence of the critical current.

According to still another specific embodiment, a set of four measuring steps are performed. The three first measuring steps are done as described previously. A fourth measuring step is performed when the external action is stopped. Then a double difference is calculated.

The fourth measurement of the $(n-1)^{th}$ set is subtracted from the first measurement of the $n^{th}$ set. The mean value of the second and third measurements is subtracted from the first difference. The result gives the first derivative of the sensed field. This embodiment allows the suppressing of possible effects of the external action on the super-current created by the sensing magnetic field.

The frequency of the sampling (measurement of one set) should be chosen so that the frequency is at least two times higher than the maximal frequency which is aimed to be detected.

The magneto-resistive element can be alternatively an anisotropic magneto-resistance (AMR), a giant magneto-resistance (GMR), a tunnel magneto-resistance (TMR) or any other resistance exhibiting a variation with the magnetic field which is large enough.

In a first possible embodiment, the external action is a current pulse injected in the superconducting loop. In case of multiple loops and/or multiple constrictions, a specific care should be taken about the possible trajectories of current. In particular it should be noted that each constriction has a current limited to its critical current and an increase of injected current will be deviated to another possible path. If there is no other possible path a voltage would possibly appear inducing the appearance of a resistance which should destroy flowing super-currents.

In an alternative embodiment, the external action is created by a magnetic field pulse applied on the superconducting loop. The strength of the field is big enough to create a super-current at least equal to the critical current of one of the constrictions. Minus the critical current is achieved by applying a negative magnetic field pulse on the superconducting loop. In this embodiment, the set of four measurements is preferably applied because the application of a magnetic pulse can modify in a non reversible way the value of the super-current (by vortex trapping phenomena for instance).

The invention claimed is:

1. A method for cancellation of low frequency noise in a magneto-resistive mixed sensor comprising at least a superconducting loop with at least one constriction and at least one magneto-resistive element associated with said at least one constriction, characterized in that it comprises a set of measuring steps with at least one measuring step being conducted with the normal running of the mixed sensor, no additional current being injected in any constriction of any loop so that only the signal to be sensed is measured, and at least another measuring step being conducted whilst an additional super-current is temporarily injected in said at least one constriction of said at least one superconducting loop of the mixed sensor up to a critical super-current of the said constriction so that the result of the said at least another measuring step is used as a reference level of said at least one magneto-resistive element, and in that the cycle of one set of measuring steps is performed at a sampling frequency which is at least two times higher than the maximal frequency to be detected.

2. A method according to claim 1, characterized in that the cancellation of low frequency noise is obtained by a set of a first and a second measuring steps, the first measuring step being conducted without any injected current whereas the second measuring step is conducted with the injection of an additional super-current, and the final measurement results in the subtraction of the result of the second measuring step from the result of the first measuring step.

3. A method according to claim 1, characterized in that at least one measuring step is conducted whilst at first an additional positive current is injected and then a negative current is injected.

4. A method according to claim 3, characterized in that the cancellation of low frequency noise is obtained by a set of three measuring steps, wherein a first measuring step is conducted without any injected current, a second measuring step is conducted with the injection of a positive additional current and a third measuring step is conducted with the injection of a negative additional current.

5. A method according to claim 3, characterized in that the cancellation of low frequency noise is obtained by a set of four measuring steps, wherein a first measuring step is conducted without any injected current, a second measuring step is conducted with the injection of a positive additional current, a third measuring step is conducted with the injection of a negative additional current and a fourth measuring step is conducted after the removal of the previously injected additional current, the result of the fourth measuring step constituting a reference for a next set of measuring steps.

6. A method according to claim 5, characterized in that a plurality of sets of four measuring steps are conducted and at the end of each set of measuring steps, the result of the fourth measuring step of the preceding set is subtracted from the result of the first measuring step of the current set to provide a first difference, the mean value of the results of the second and third measuring steps of the current set is subtracted from said first difference to provide a second difference and the mean value of the results of the second and third measuring steps of the first set is added to the second difference as a reference of zero super-current.

7. A method according to any one of claims 1 to 6, characterized in that the additional current is injected by wires in some part of the superconducting loop of the mixed sensor.

8. A method according to any one of claims 1 to 6, characterized in that the additional current is injected by the use of an additional magnetic field applied on the superconducting loop of the mixed sensor.

* * * * *